(12) United States Patent
Yoon

(10) Patent No.: US 7,666,697 B2
(45) Date of Patent: Feb. 23, 2010

(54) THIN FILM TRANSISTOR SUBSTRATE AND METHOD OF MANUFACTURING THE SAME

(75) Inventor: Joo-sun Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 136 days.

(21) Appl. No.: 11/455,450

(22) Filed: Jun. 19, 2006

(65) Prior Publication Data

US 2006/0289871 A1 Dec. 28, 2006

(30) Foreign Application Priority Data

Jun. 24, 2005 (KR) ........................ 10-2005-0055046

(51) Int. Cl.
*H01L 21/00* (2006.01)
*H01L 31/00* (2006.01)

(52) U.S. Cl. .................... 438/48; 438/30; 438/128; 438/149; 438/151; 438/157; 438/161; 438/283; 257/59; 257/E21.414

(58) Field of Classification Search .................. 438/30, 438/48, 128, 149, 151, 157, 161, 283; 257/59, 257/E21.414
See application file for complete search history.

(56) References Cited

U.S. PATENT DOCUMENTS

| | | | |
|---|---|---|---|
| 6,333,518 B1 * | 12/2001 | Seo ........................ 257/72 |
| 6,849,873 B2 * | 2/2005 | Baek et al. ................ 257/72 |
| 6,933,568 B2 * | 8/2005 | Yang et al. ............... 257/347 |
| 7,189,998 B2 * | 3/2007 | Cha et al. ................. 257/72 |
| 2005/0024549 A1 * | 2/2005 | Gotoh et al. ............... 349/43 |
| 2006/0139504 A1 * | 6/2006 | Ahn et al. .................. 349/42 |

* cited by examiner

*Primary Examiner*—Long K Tran
(74) *Attorney, Agent, or Firm*—F. Chau & Associates, LLC

(57) ABSTRACT

A thin film transistor (TFT) substrate having an improved wire structure without an under-cut phenomenon that may occur during formation of a gate wire having a double-layered structure and a method of manufacturing the same are provided, where the method includes forming a first metal layer made of at least one low resistance material selected from the group consisting of Al, AlNd, Cu, and Ag, forming a second metal layer made of at least one heat-resistant, etch-resistant material selected from the group consisting of Cr, CrNx, Ti, Mo, and MoW on the first metal layer, forming an etch mask on the second metal layer, sequentially etching the second metal layer and the first metal layer using the etch mask, and forming a second metal layer pattern and a first metal layer pattern, respectively, and selectively re-etching the second metal layer pattern using the etch mask to make a width of the second metal layer pattern smaller than or substantially equal to a width of the first metal layer pattern, and completing a gate wire.

20 Claims, 13 Drawing Sheets

THIN FILM TRANSISTOR SUBSTRATE AND METHOD OF MANUFACTURING THE SAME

CROSS-REFERENCE TO RELATED APPLICATION

This application claims foreign priority under 35 U.S.C. § 119 to Korean Patent Application No. 10-2005-0055046, filed on Jun. 24, 2005 in the Korean Intellectual Property Office, the disclosure of which is incorporated by reference herein in its entirety.

BACKGROUND OF THE INVENTION

1. Field of the Invention

The present disclosure relates to methods of manufacturing thin film transistor (TFT) substrates, and more particularly relates to methods of manufacturing TFT substrates having gate wires with double-layered structures.

2. Description of the Related Art

A liquid crystal display (LCD) includes a common electrode display panel having a color filter and a thin film transistor (TFT) display panel having a TFT array. The common electrode and TFT display panels are opposite to and face each other, and are attached to each other by a seal line disposed therebetween. A liquid crystal layer is formed in a predetermined gap created between the two panels. As described above, an LCD generally includes two substrates, each having an electrode formed on an inner surface thereof, and a liquid crystal layer interposed between the two substrates. In an LCD, a voltage is applied to the electrode to rearrange liquid crystal molecules and control an amount of light transmitted through the liquid crystal layer. Since an LCD is a non-emissive device, a backlight module is required for supplying a source light for a TFT of the LCD. Transmittance of the source light supplied from the backlight module is controlled according to the aligned states of liquid crystals.

In general, a gate wire and a data wire including source/drain are formed on the TFT substrate for use in the LCD. Here, the gate and data wires each may be a single layer, or they may have a double-layered or a triple-layered structure such as to prevent the gate and data wires from being over-etched in a subsequent etching process. For example, the gate wire generally may have a double-layered structure made of a chromium (Cr) layer and an aluminum (Al) layer.

A process of forming the gate wire will now be described briefly. First, chromium and aluminum are sequentially deposited on a glass substrate to form a double-layered stack on the glass substrate, followed by performing exposing and developing the formed double-layered stack using a photo mask to form a pattern. Then, wet etching is performed for sequentially etching the upper aluminum (Al) layer and the lower chromium (Cr) layer, giving a wire corresponding to the mask pattern.

When the upper aluminum (Al) layer and the lower chromium (Cr) layer are wet etched using the mask during formation of the gate wire, a skew phenomenon may occur, so that a width of a chromium gate wire is reduced compared to a width of an aluminum gate wire. The skew phenomenon may be caused by an undercut problem. Defects in an LCD, such as horizontal stripes, result from the undercut problem occurring at the lower chromium (Cr) layer.

One conventional way to avoid such defects is to perform a photo-etch process on each layer independently, or to sequentially etch an upper aluminum (Al) layer and a lower chromium (Cr) layer, followed by etching the upper aluminum (Al) layer once more. In the former case, however, the number of masks used in the process increases, which increases the manufacturing cost. In the latter case, that is, when the upper aluminum (Al) layer is etched twice, adhesion between an upper photo resist (PR) and the upper aluminum (Al) layer is poor, so that a gate wire having a uniform pattern cannot be attained.

SUMMARY OF THE INVENTION

The present disclosure provides a method of manufacturing a thin film transistor substrate that can prevent a gate wire from being undercut when the gate wire is formed as a double-layered stack. The present disclosure also provides a thin film transistor substrate manufactured by the method. The above and other features and aspects of the present disclosure will become clear to those skilled in the art upon review of the descriptions that follow.

According to an aspect of the present disclosure, there is provided a method of manufacturing a thin film transistor substrate. The method includes forming a first metal layer made of at least one low resistance material selected from the group consisting of Al, AlNd, Cu, and Ag, forming a second metal layer made of at least one heat-resistant, etch-resistant material selected from the group consisting of Cr, CrNx, Ti, Mo, and MoW on the first metal layer, forming an etch mask on the second metal layer, sequentially etching the second metal layer and the first metal layer using the etch mask, and forming a second metal layer pattern and a first metal layer pattern, respectively, and selectively re-etching the second metal layer pattern using the etch mask to make a width of the second metal layer pattern smaller than or substantially equal to a width of the first metal layer pattern, and finally completing a gate wire.

According to another aspect of the present disclosure, there is provided a thin film transistor (TFT) substrate comprising a plurality of gate wires formed on an insulating substrate, the plurality of gate wires each including a first metal layer pattern made of at least one low resistance material selected from the group consisting of Al, AlNd, Cu, and Ag, and a second metal layer pattern made of at least one heat-resistant, etch-resistant material selected from the group consisting of Cr, CrNx, Ti, Mo, and MoW on the first metal layer pattern, wherein a width of the second metal layer pattern is smaller than or substantially equal to a width of the first metal layer pattern, a semiconductor pattern formed on the gate wires, a plurality of data wires each including source/drain electrodes separately formed on the semiconductor pattern, a TFT connected to the data wire and the gate wire, a passivation layer on the data wire, and a pixel electrode formed at a pixel area defined by the gate wire and the data wire.

BRIEF DESCRIPTION OF THE DRAWINGS

The above and other features and aspects of the present disclosure will become more apparent by describing in detail preferred embodiments thereof with reference to the attached drawings, in which.

DETAILED DESCRIPTION OF PREFERRED EMBODIMENTS

Figure 1:
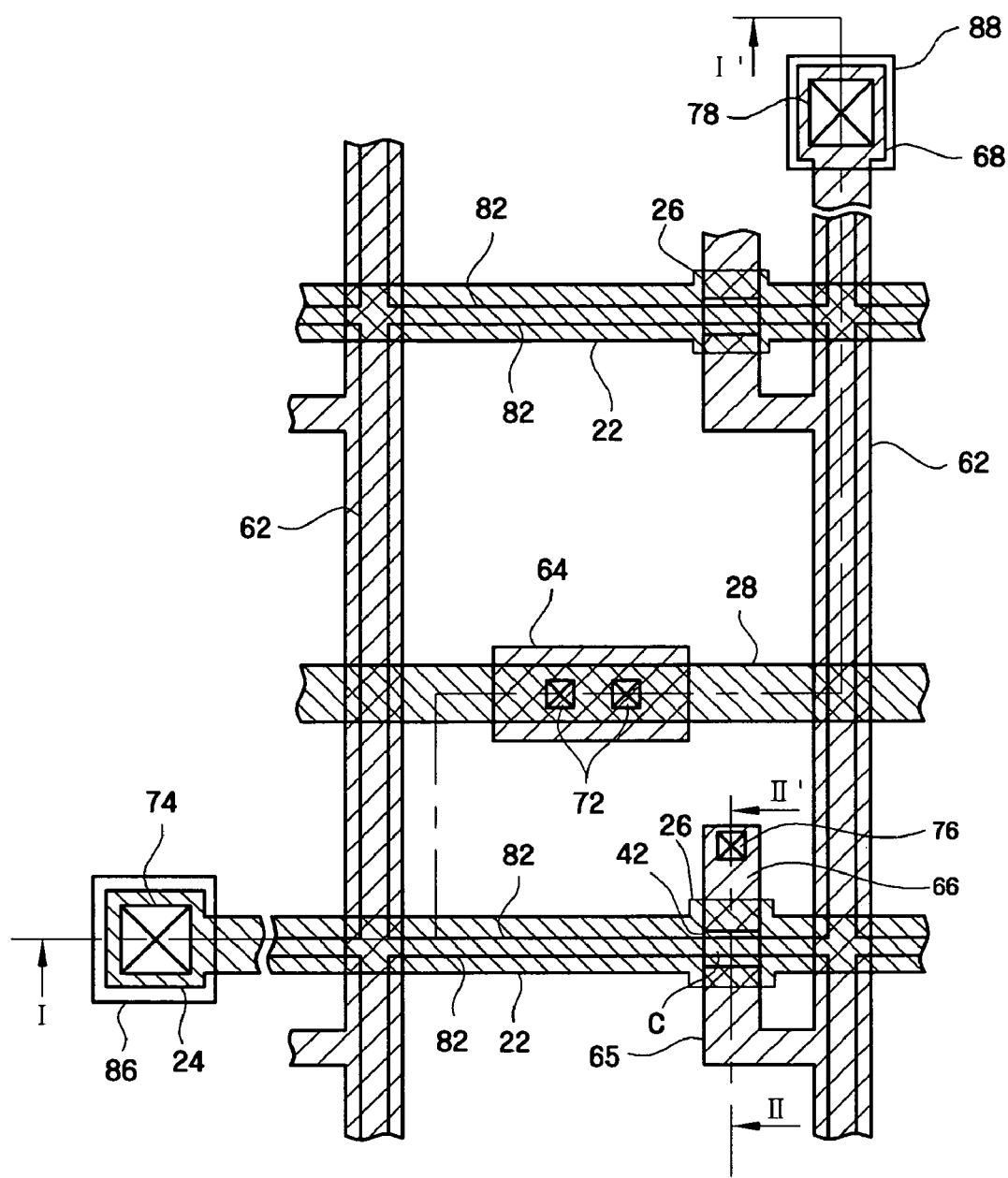
FIG. 1 is a layout view of a thin film transistor (TFT) substrate according to an embodiment of the present disclosure.

Features and aspects of the present disclosure, and methods of accomplishing the same, may be understood more readily with reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals may refer to like elements throughout the specification.

Figure 2:
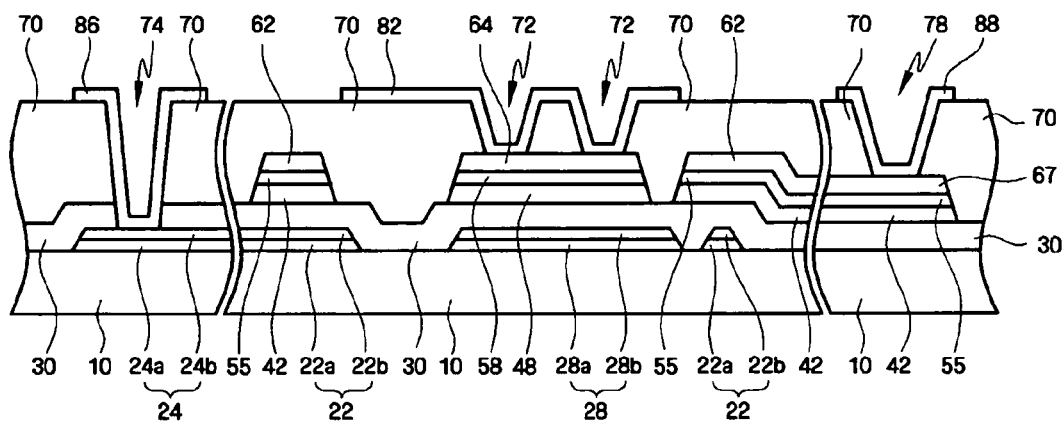
FIG. 2 is a cross-sectional view of a thin film transistor (TFT) substrate taken along the line I-I' shown in FIG. 1.
Figure 3:
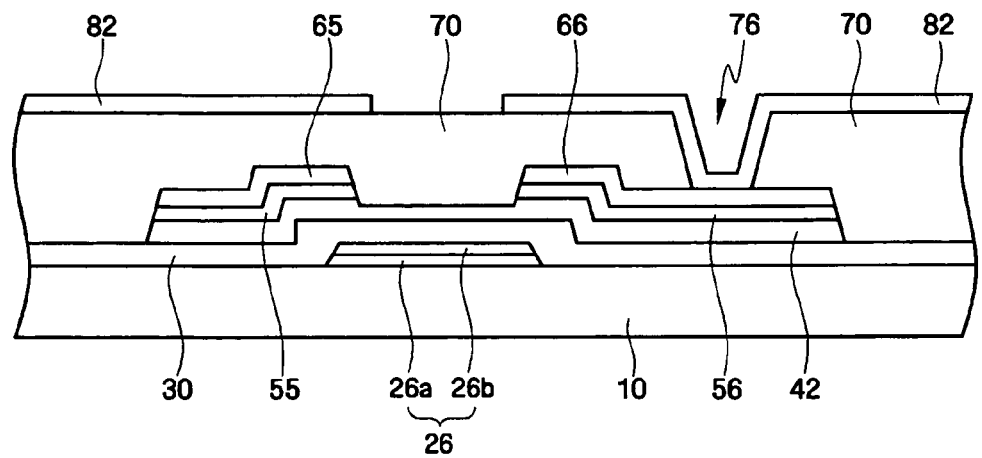
FIG. 3 is a cross-sectional view of a thin film transistor (TFT) substrate taken along the line II-II' shown in FIG. 1.

A TFT substrate will now be described in greater detail with reference to FIGS. 1 through 3. FIG. 1 is a layout view of a thin film transistor (TFT) substrate according to an embodiment of the present disclosure; FIG. 2 is a cross-sectional view of a thin film transistor (TFT) substrate taken along the line I-I' shown in FIG. 1; and FIG. 3 is a cross-sectional view of a thin film transistor (TFT) substrate taken along the line II-II' shown in FIG. 1.

A gate wire (22, 24, 26) and a storage electrode line 28 are formed on an insulating substrate 10. The gate wire (22, 24, 26) includes a gate line 22 extending in a transverse direction, a gate line pad 24, connected to an end of the gate line 22, receiving a gate signal from an external source and transmitting the received gate signal to the gate line 22, and a gate electrode 26 of a TFT, which is connected to the gate line 22.

The storage electrode line 28 overlaps with a storage capacitor conductor pattern 68 connected with a pixel electrode 82, forming a storage capacitor that enhances a charge storage capacitor of a pixel. When a storage capacitor generated by overlapping of the pixel electrode 82 and the gate line 22 is sufficient, formation of the storage electrode line 29 may be omitted. Generally, a voltage, the same level of which is applied to a common electrode of a common electrode display panel, is applied to the storage electrode line 28.

Here, the gate wire (22, 24, 26) and the storage electrode line 28 may be formed as a single layer made of a metal or as a double-layered stack consisting of a lower inorganic layer and an upper organic layer. One example of the gate wire (22, 24, 26) having such a double-layered stack and the storage electrode line 28 will be described in the following description.

When the gate wire (22, 24, 26) is formed as a double-layered stack, a first metal layer and a second metal layer are sequentially formed on a glass substrate. Here, the first metal layer may be made of Al, AlNd, Cu, or Ag, and the second metal layer may be made of Cr, CrNx, Ti, Mo, or MoW. A gate insulating layer 30 made of silicon nitride (SiNx) is formed on and cover the gate wire (22, 24, 26) and the storage electrode line 28.

A semiconductor pattern 42, 48 made of a semiconductor such as hydrogenated amorphous silicon (a-Si) is formed on the gate insulating layer 30. An ohmic contact layer 55, 56, 58 made of a material like n+ hydrogenated amorphous silicon heavily doped with n-type impurities such as silicide are formed on the semiconductor pattern 42, 48.

A data wire (62, 64, 65, 66, 68) is formed on the ohmic contact layer 55, 56, 58. The data wire (62, 64, 65, 66, 68) includes a plurality of data line units 62, 65 and 68, a plurality of drain electrodes 66 for TFTs, and a plurality of storage capacitor conductors 64. Each of the data line units 62, 65 and 68 includes a data line 62 extending in the longitudinal direction, a data line pad 68 connected to one end of the data line 62 to receive image signals from an external device, and a plurality of source electrodes 65 of TFTs branched from the data line 62. Each drain electrode 66 is separated from the data line units 62, 65 and 68 and placed opposite to the corresponding source electrode 65 with respect to the corresponding gate electrode 26 or the channel area "C" of the TFT. The storage capacitor conductors 64 are placed over the storage electrode lines 28. In the absence of the storage electrode lines 28, the storage capacitor conductors 64 are also omitted.

The ohmic contact layer 55, 56, 58 reduces the contact resistance between the underlying semiconductor pattern 42, 48 and the overlying data wire (62, 64, 65, 66, 68), and has substantially the same shape as the data wire (62, 64, 65, 66, 68). That is, the ohmic contact layer 55, 56, 58 includes a plurality of data-line ohmic contact layers 55 having substantially the same shapes as the data line units 62, 68 and 65, a plurality of drain-electrode ohmic contact layers 56 having substantially the same shapes as the drain electrodes 66, and a plurality of storage-capacitor ohmic contact layers 58 having substantially the same shapes as the storage capacitor conductors 64.

Meanwhile, the semiconductor pattern 42, 48 has substantially the same shape as the data wire (62, 64, 65, 66, 68) and the ohmic contact layer 55, 56, 58 except for the TFT channel area "C". Specifically, the semiconductor pattern 42, 48 includes a plurality of storage-capacitor semiconductor patterns 48 having substantially the same shapes as the storage capacitor conductors 64 and the storage-capacitor ohmic contact layer 58, and a plurality of TFT semiconductor patterns 42, which have slightly different shapes from the remainders of the data wire and the ohmic contact pattern. That is, the source and the drain electrodes 65 and 66 are separated from each other at the TFT channel area "C", where the data-line ohmic contact layer 55 and the drain-electrode ohmic contact layer 56 are also separated from each other. However, the TFT semiconductor patterns 42 continue to proceed there without disconnection to form TFT channel area "C".

A side wall formed by the semiconductor pattern 42, 48, the ohmic contact layer 55, 56, 58 and the data wire (62, 64, 65, 66, 68) has an improved profile. A passivation layer 70 is formed on the data wire (62, 64, 65, 66, 68). The passivation layer 70 preferably includes a SiNx layer, an a-Si:C:O layer or an a-Si:O:F layer deposited by PECVD (a low dielectric CVD layer), or an organic insulating layer. The passivation layer 70 has a plurality of contact holes 72, 76 and 78 exposing the storage capacitor conductors 64, the drain electrodes 66 and the data line pads 68. The passivation layer 70 together with the gate insulating layer 30 is further provided with a plurality of contact holes 74 exposing the gate line pads 24.

A pixel electrode 82, receiving an image signal from the TFT and generating an electric field in cooperation with an electrode of an upper panel, is formed on the passivation layer 70. The pixel electrode 82 is formed of a transparent conductive material such as ITO and IZO. The pixel electrode 82 is physically and electrically connected to the drain electrode 66 through the contact hole 76 to receive the image signal. The pixel electrode 82 overlaps the neighboring gate line 22 and the adjacent data line 62 to enlarge the aperture ratio, but the overlapping may be omitted. The pixel electrode 82 may also be connected to the storage capacitor conductor 64 through the contact hole 72 to transmit the image signal to the conductor 64. Meanwhile, a plurality of auxiliary gate line pads 86 and a plurality of auxiliary data line pads 88 are formed on the gate line pads 24 and the data line pads 68 to be connected thereto through the contact holes 74 and 78, respectively. The auxiliary gate line pads 86 and the auxiliary data line pads 88 compensate the adhesiveness of the gate line pads 24 and 68 to external circuit devices and protect the pads 24 and 68. The auxiliary gate line pads 86 and the auxiliary data line pads 88 are not requisites but may be introduced in a selective manner.

A method of manufacturing the TFT substrate according to an embodiment of the present disclosure will be now described in detail with reference to FIGS. 4A through 12F.

Figure 4A:
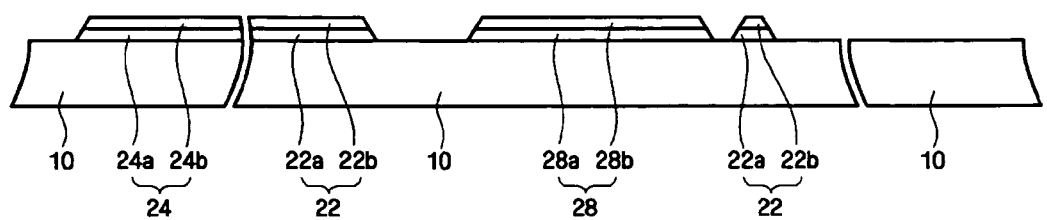
FIGS. 4A through 11B are cross-sectional views of stages in a method of manufacturing the TFT substrate shown in FIG. 1.
Figure 4B:
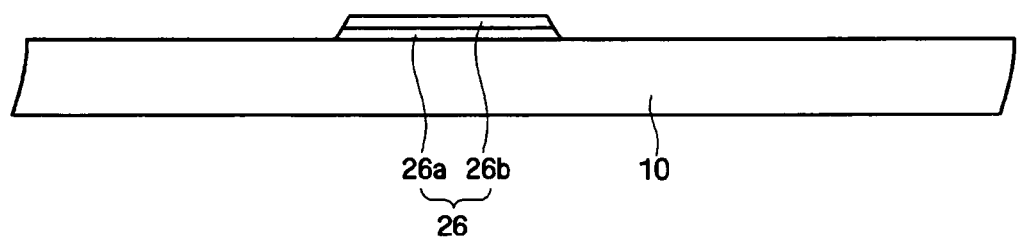

FIGS. 4A through 11B are cross-sectional views of stages in a method of manufacturing the TFT substrate shown in FIG. 1, and FIGS. 12A through 12F are cross-sectional views of stages in a method of forming a gate wire (22, 24, 26) shown in FIGS. 4A and 4B.

Referring first to FIGS. 4A and 4B, a gate wire (22, 24, 26), including a gate line 22, a gate electrode 26, and a gate line pad 24, and a storage electrode line 28, is deposited on an insulating substrate 10. A process of the gate wire (22, 24, 26) will later be described with reference to FIGS. 12A through 12F.

To form the gate wire (22, 24, 26), a conductor for forming a gate wire is first stacked on the insulating substrate 10. Here, the conductor may be as a single layer made of aluminum or may be formed as a double layered stack consisting of a first metal layer 220a and a second metal layer 220b.

Figure 12A:
FIGS. 12A through 12F are cross-sectional views of stages in a method of forming a gate wire according to an embodiment of the present disclosure.

When the conductor is formed as a double layered stack, as shown in FIG. 12A, the first metal layer 220a and the second metal layer 220b are sequentially formed on the insulating substrate 10. Here, the first metal layer 220a may be made of a low resistance material such as Al, AlNd, Cu, or Ag, and the second metal layer 220b may be made of a heat-resistant, etch-resistant material such as Cr, CrNx, Ti, Mo, or MoW. The second metal layer 220b made of such a heat-resistant, etch-resistant material. A material as stated above is well adhered to a photoresist layer 100 to be formed in a subsequent process, thereby providing for a uniform pattern when the second metal layer 220b is secondarily etched. An exemplary embodiment in which the first metal layer 220a is made of aluminium and the second metal layer 220b is made of chromium will be illustrated in the following description.

When the second metal layer 220b is made of Cr, a third metal layer 220c comprising chromium nitride (CrNx) is preferably formed thereon to a predetermined thickness. The CrNx layer 220c formed on the second metal layer 220b, together with contact holes and a transparent electrode to be formed in a subsequent step, reduces contact resistance between the second metal layer 220b and the transparent electrode.

Figure 12B:
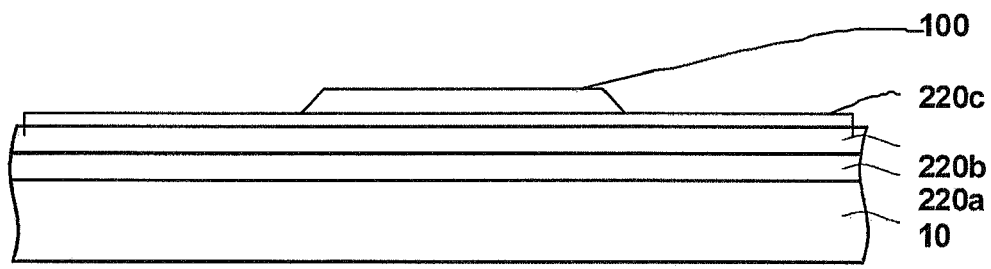

As described above, if the conductor consisting of the first metal layer 220a, the second metal layer 220b and preferably the third metal layer 220c is stacked on the insulating substrate 10, a photoresist layer 100 is coated on the second metal layer 220b or preferably the third metal layer 220c for being patterned by photolithography and developed, thereby forming an etch mask on the second metal layer 220b or preferably the third metal layer 220c, as shown in FIG. 12B.

Figure 12C:
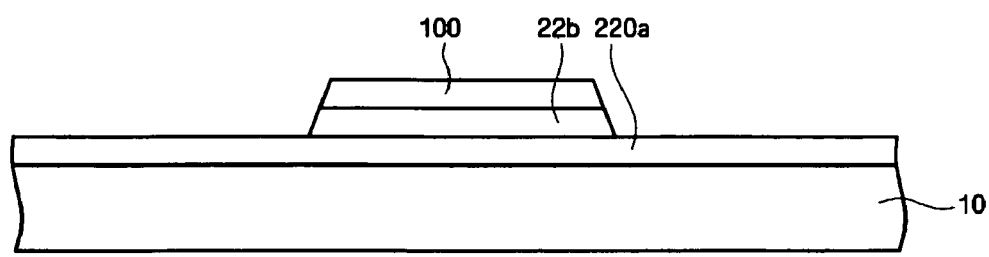
Figure 12D:
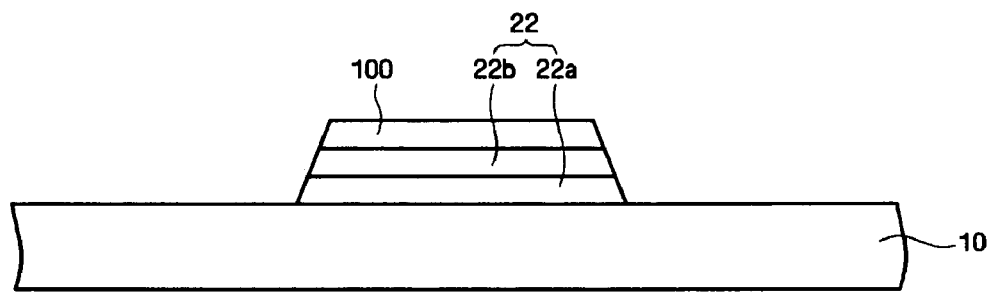

Referring to FIGS. 12C and 12D, the second metal layer 220b and the first metal layer 220a are sequentially etched using the etch mask to form a second metal layer pattern 22b and a first metal layer pattern 22a. That is, the use of the etch mask enables the second metal layer pattern 22b and the first metal layer pattern 22a to be formed from the second metal layer 220b and the first metal layer 220a through etching. Here, the second metal layer 220b and the first metal layer 220a may be patterned by wet etching. In addition, the etch mask may be removed after removing the second metal layer 220b.

Alternatively, the second metal layer 220b and the first metal layer 220a may be simultaneously patterned using the etch mask. Here, the second metal layer 220b and the first metal layer 220a may be patterned by dry etching.

Figure 12E:
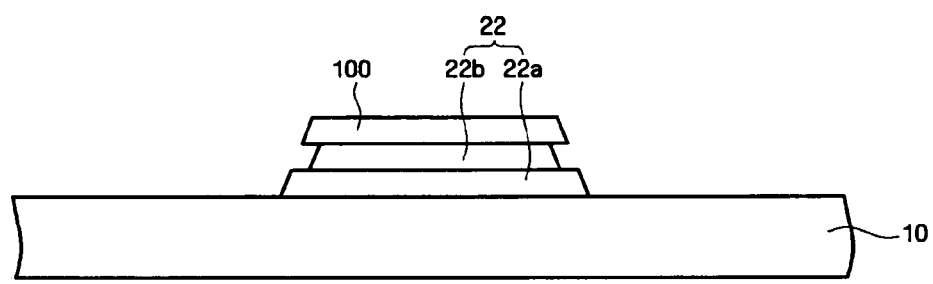
Figure 12F:
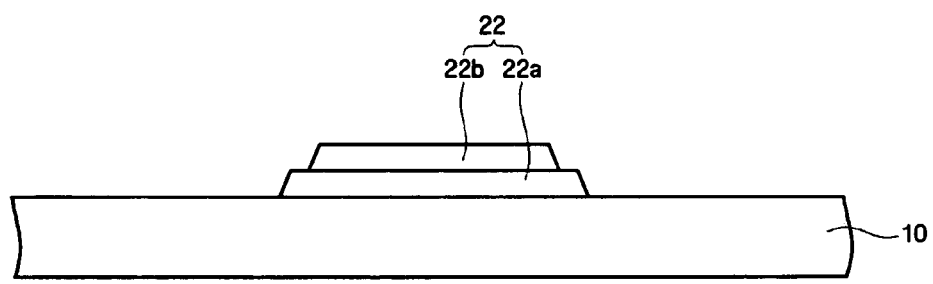

In this case, after forming the second metal layer pattern 22b and the first metal layer pattern 22a, the second metal layer pattern 22b may be selectively re-etched using an etch mask, which makes a width of the second metal layer pattern 22b smaller than or equal to a width of the first metal layer pattern 22a. For example, as shown in FIG. 12E, it is preferable that a width of the second metal layer pattern 22b be smaller than a width of the first metal layer pattern 22a. Then, the etch mask remaining on the second metal layer pattern 22b is removed, thereby finally completing the gate wire (22, 24, 26) having a portion of the second metal layer pattern 22b that is made thinner than the first metal layer pattern 22a, as shown in FIG. 12F. Here, it is preferable that a distance between a sidewall of the first metal layer pattern 22a and a sidewall of the second metal layer pattern 22b be equal to or less than 1 μm.

Figure 5A:
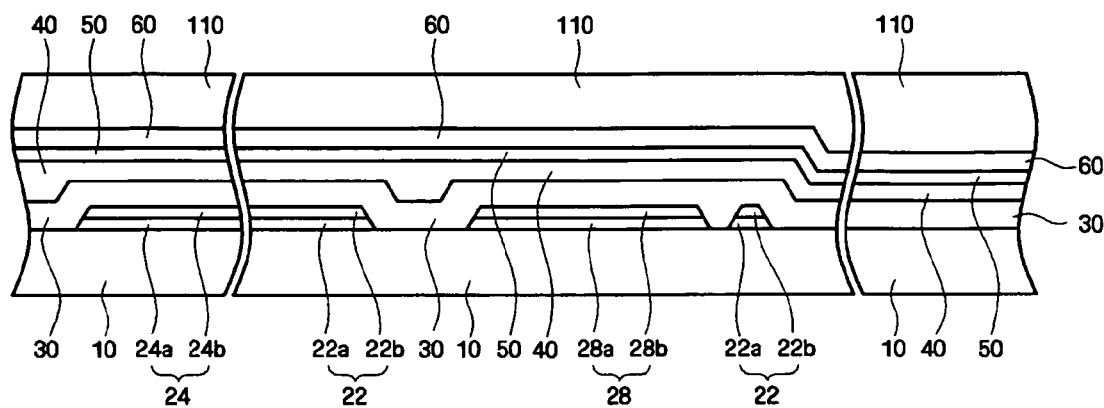
Figure 5B:
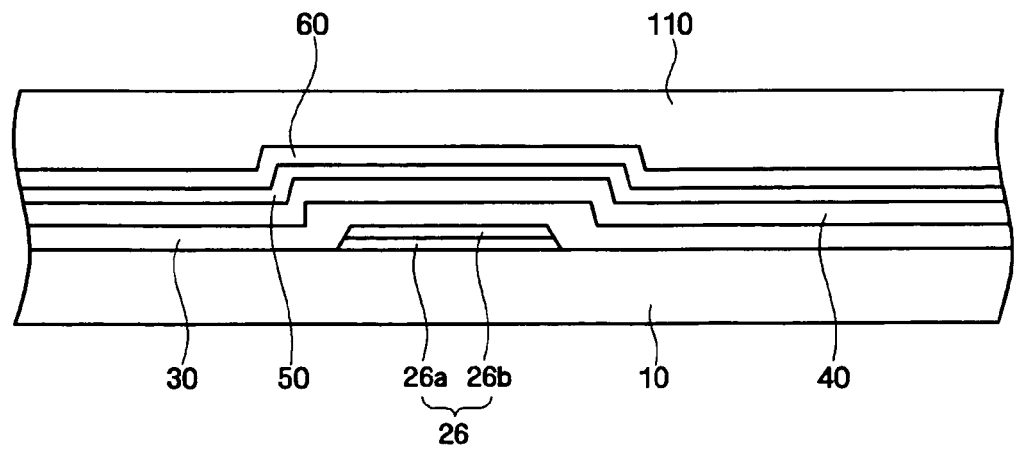

After the gate wire (22, 24, 26) and the storage electrode line 28 are formed on the insulating substrate 10, as shown in FIGS. 5A and 5B, a gate insulating layer 30, a semiconductor layer 40 and an ohmic contact layer 50 are sequentially stacked on the resultant structure by chemical vapor deposition (CVD). Then, sputtering is performed to form a conductive layer 60 for a data wire. Here, the conductive layer 60 for a data wire may be formed as a single layer made of molybdenum (Mo) to a thickness of, for example, about 3000 Å to about 4000 Å. Alternatively, the conductive layer 60 for a data wire may have a double-layered structure including a molybdenum (Mo) layer and an aluminum (Al) layer, although it is not limited thereto.

Figure 6A:
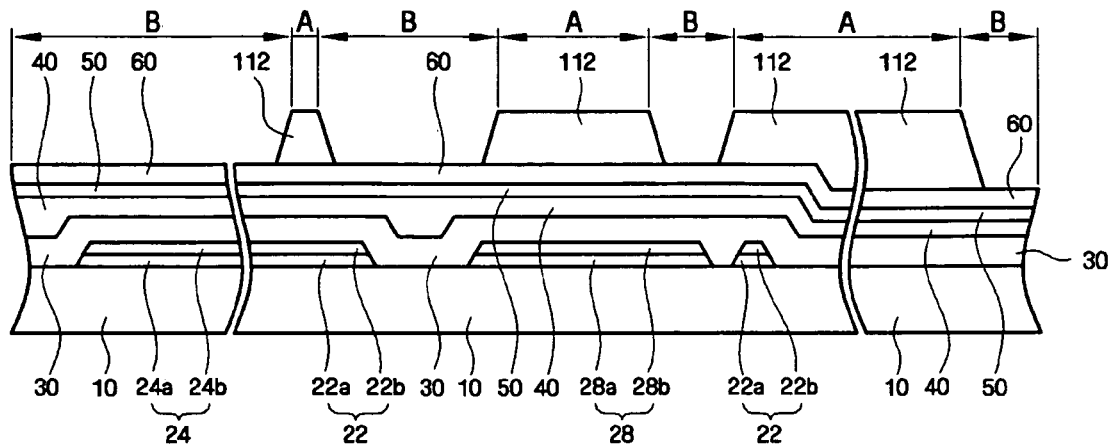
Figure 6B:
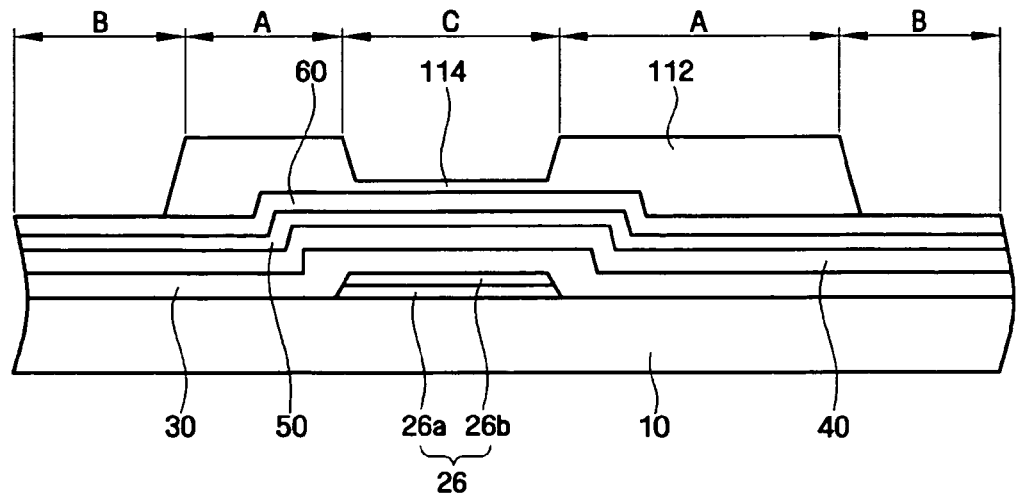

A photoresist film 110 is coated on the conductive layer 60 to a thickness of 1 to 2 μm. Thereafter, the photoresist film 110 is exposed to light through a mask and is developed to form a photoresist pattern (112 and 114) having a plurality of first portions 114 and a plurality of second portions 112, as shown in FIGS. 6A and 6B. Each of the first portions 114 of the photoresist pattern (112 and 114) is located on the channel area "C" of a TFT, which is placed between a source electrode 65 and a drain electrode 66. Each of the second portions 112 is located on a data wire area "A" located at a place where a data wire (62, 64, 65, 66, 68) will be formed. All portions of the photoresist film 110 on the remaining areas "B" are removed, and the first portions 114 are made to be thinner than the second portions 112. Here, the ratio of the thickness of the first portion 114 on the channel area "C" and the second portion 112 on the data wire area "A" is adjusted depending on process conditions of subsequent etching steps, and it is preferable that the thickness of the first portion 114 is equal to or less than about a half of that of the second portion 112, for example, equal to or less than 4,000 Å.

As described above, the position-dependent thickness of the photoresist pattern (112 and 114) is obtained by several techniques. A slit pattern, a lattice pattern or a translucent film is provided on the mask in order to adjust the light transmittance in the data wire area "A".

When using a slit pattern, it is preferable that a width of the slits and a gap between the slits is smaller than the resolution of an exposer used for the photolithography. In a case of using a translucent film, thin films with different transmittances or different thickness may be used to adjust the transmittance on the masks.

When a photoresist film is exposed to light through such a mask, polymers of a portion directly exposed to the light are almost completely decomposed, and those of a portion exposed to the light through a slit pattern or a translucent film are not completely decomposed because the amount of a light irradiation is small. The polymers of a portion of the photoresist film blocked by a light-blocking film provided on the mask are hardly decomposed. After the photoresist film is developed, the portions containing the polymers, which are not decomposed, remains. At this time, the thickness of the portion with less light exposure is thinner than that of the portion without light exposure. Since too long an exposure time decomposes all the molecules, it is necessary to adjust the exposure time.

The first portion 114 of the photoresist pattern (112 and 114) may be obtained using reflow. That is, the photoresist film is made of a reflowable material and exposed to light through a normal mask having opaque and transparent portions. The photoresist film is then developed and subject to reflow such that portions of the photoresist film flows down onto areas without photoresist, thereby forming the thin first portion 114.

Figure 7A:
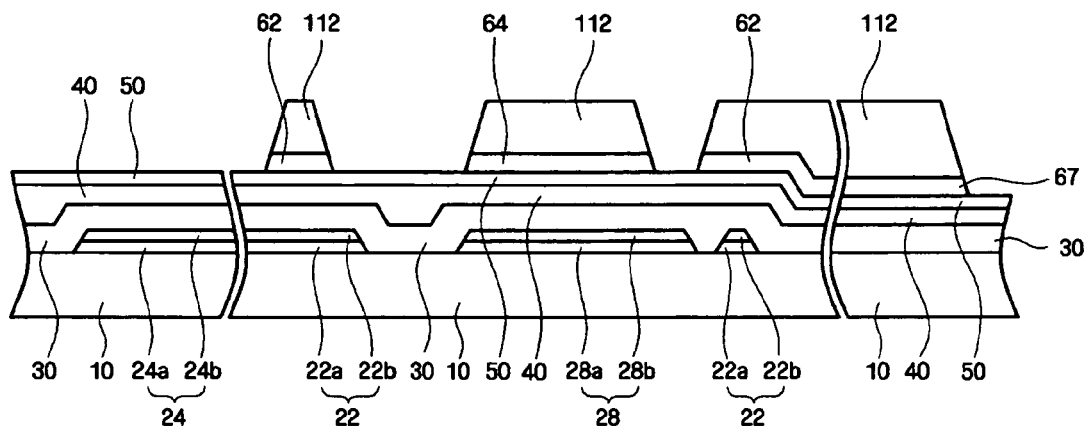
Figure 7B:
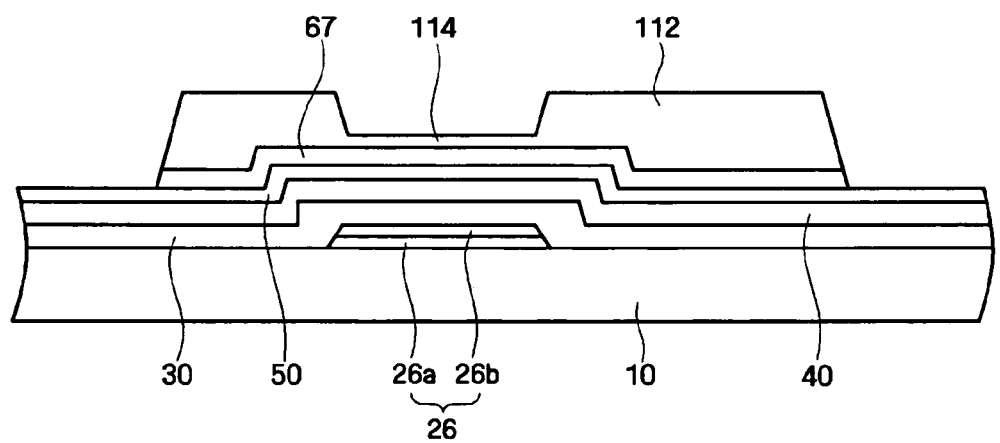

Next, as shown in FIGS. 7A and 7B, the ohmic contact layer 50 is exposed by removing the conductive layer 60 with the remaining areas "B" left on the channel area "C". Here, wet etching may be performed. Preferably, etching is performed under the condition that the conductive layer 60 is etched but the photoresist pattern (112 and 114) is hardly etched.

Figure 8A:
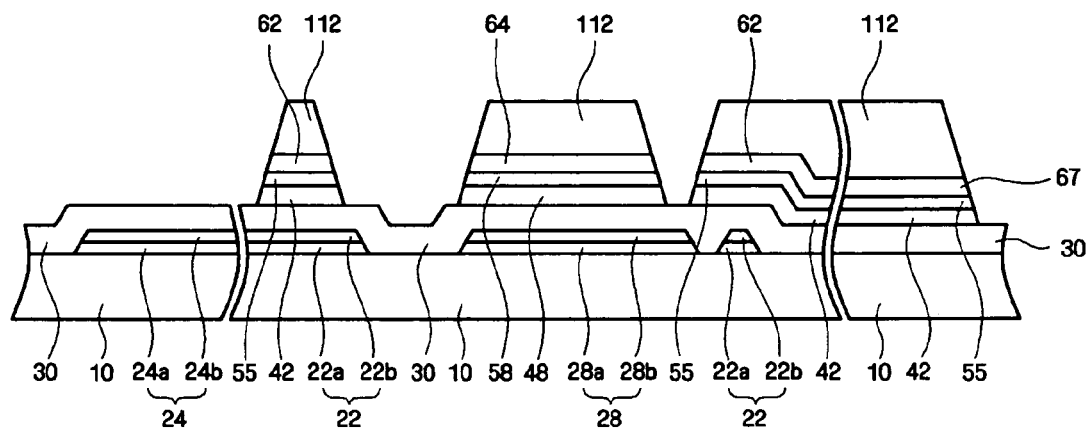
Figure 8B:
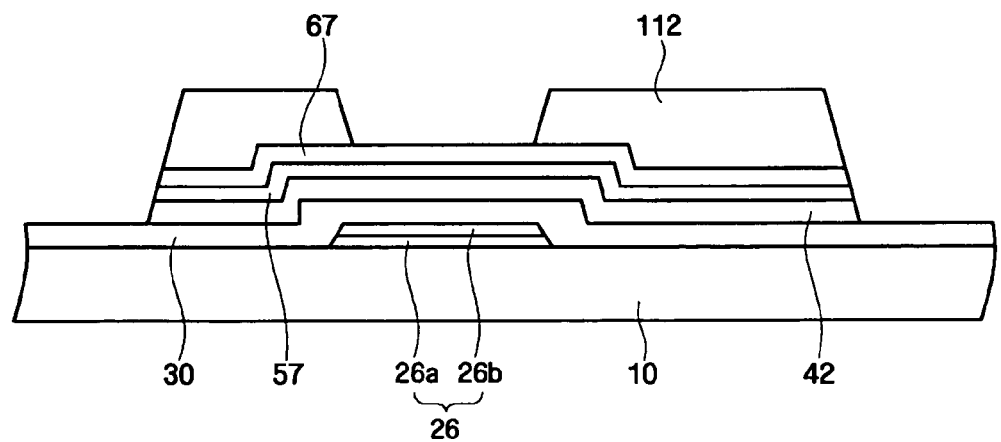

Then, as shown in FIGS. 8A and 8B, the exposed portion of the ohmic contact layer 50 left on the remaining areas "B" and the underlying semiconductor layer 40 are etched to be removed together with the first portion 114 of the photoresist film. Here, the photoresist pattern (112 and 114), the ohmic contact layer 50 and the semiconductor layer 40 are simultaneously etched. It is noted that the amorphous silicon layer and the intermediate layer have no etching selectivity. The etching may be performed under the condition that the gate insulating layer 30 may not be etched. Particularly, the etching ratios of the photoresist pattern (112 and 114) and the semiconductor layer 40 may be substantially equal to each other. For example, the film and the layer are etched to substantially the same thickness using a gas mixture of $SF_6$ and HCl or a gas mixture of $SF_6$ and $O_2$. For the equal etching ratios of the photoresist pattern (112 and 114) and the semiconductor layer 40, the thickness of the first portion 114 is preferably equal to or less than the sum of the thicknesses of the semiconductor layer 40 and the ohmic contact layer 50. In this way, the first portion 114 on the channel area "C" is removed to expose the source/drain conductor pattern 67, and the ohmic contact layer 50 and the semiconductor layer 40 on the remaining areas "B" are removed to expose the underlying portions of the gate insulating layer 30.

Meanwhile, the second portions 112 on the data wire areas "A" are also etched to have reduced thickness. In this step, the formation of semiconductor patterns 42 and 48 is completed. Reference numerals 57 and 58 indicate an ohmic contact layer underlying the source/drain conductor pattern 67 and an ohmic contact layer underlying a storage capacitor conductor pattern 64, respectively. Subsequently, residue of the photoresist remaining on the source/drain conductor pattern 67 on the channel area "C" is removed by ashing.

Figure 9A:
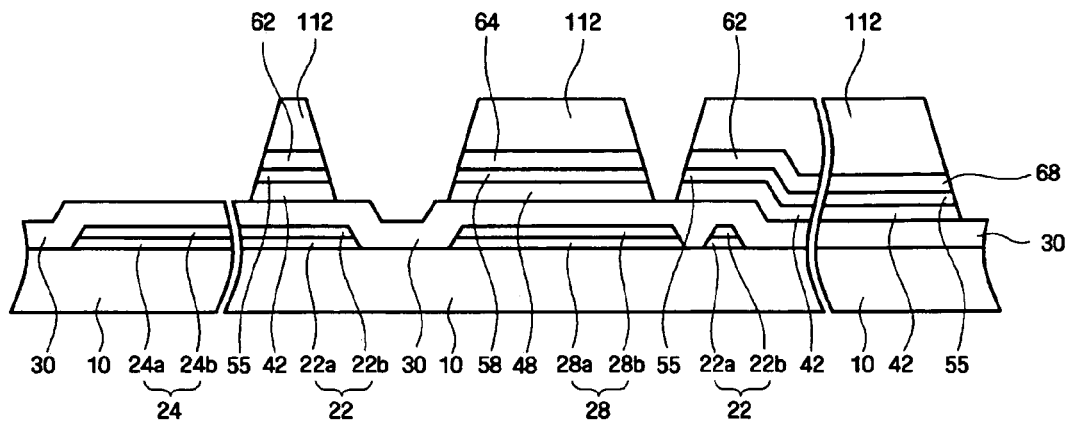
Figure 9B:
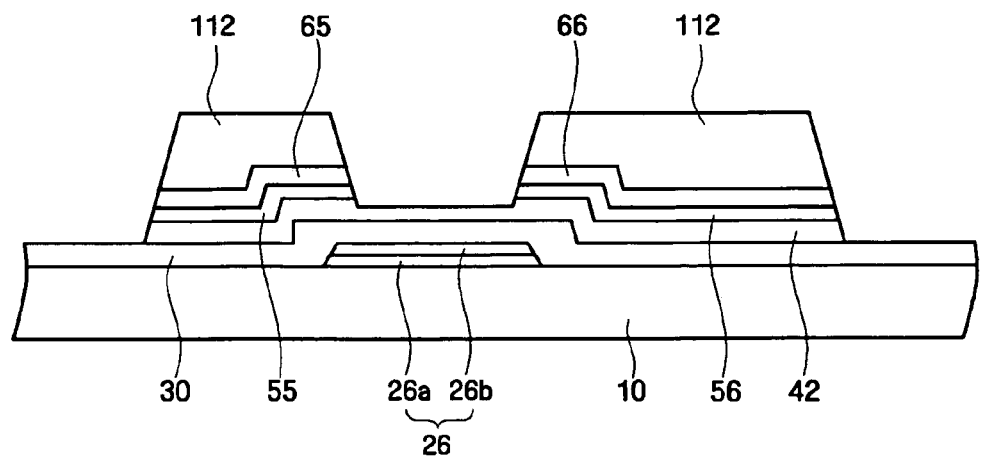

Next, the source/drain conductor pattern 67 on the channel area "C" and the underlying portions of the ohmic contact layer 57 are etched to be removed. Here, wet etching is applied to etch the source/drain conductor pattern 67 and the ohmic contact layer 57. In addition, as shown in FIG. 9B, top portions of a semiconductor pattern 42 may be removed to cause thickness reduction, and second portions 112 of a photoresist pattern is etched to a predetermined thickness. In this way, as shown in FIGS. 9A and 9B, the source and the drain electrodes 65 and 66 are separated from each other while completing the formation of the data wire (62, 64, 65, 66, 68) and the underlying ohmic contact layer 55, 56, 58.

Finally, the second portions 112 remaining on the data wire areas "A" are removed. However, the removal of the second portions 112 may be made between the removal of the portions of the source/drain conductor pattern 67 on the channel area "C" and the removal of the underlying portions of the ohmic contact layer 57.

Figure 10A:
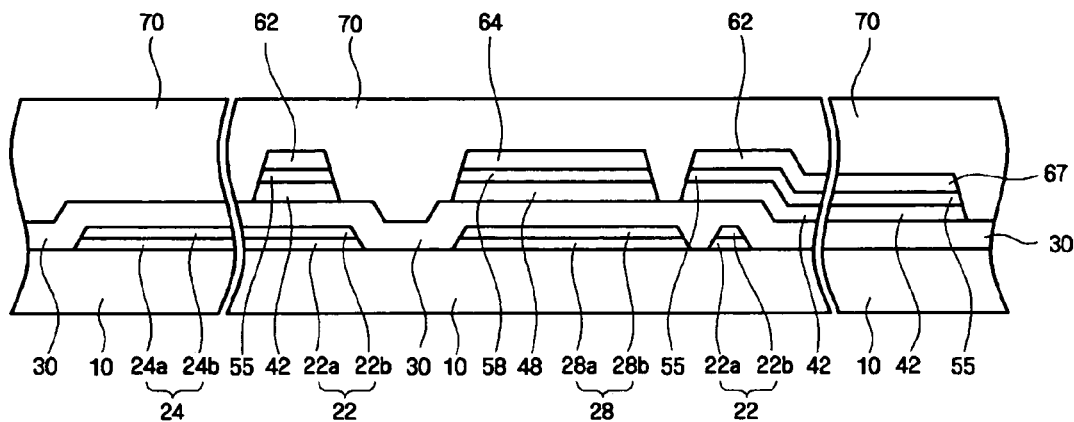
Figure 10B:
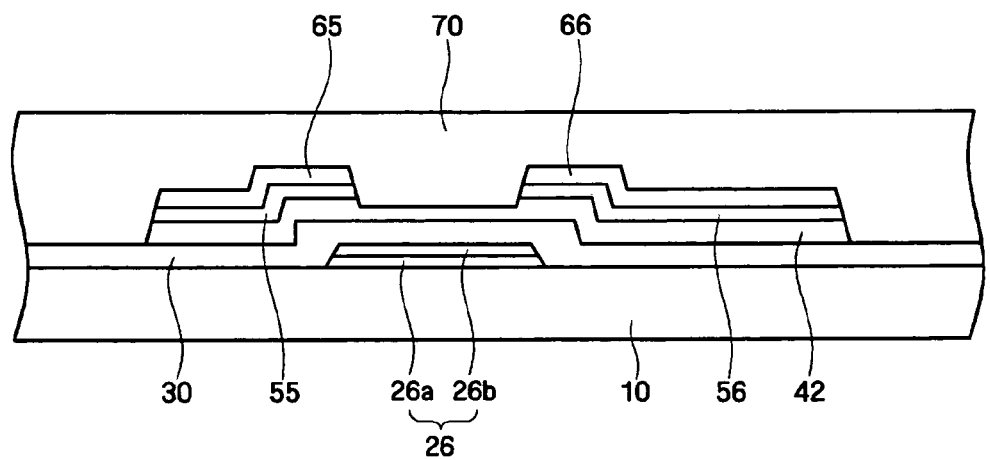
Figure 11A:
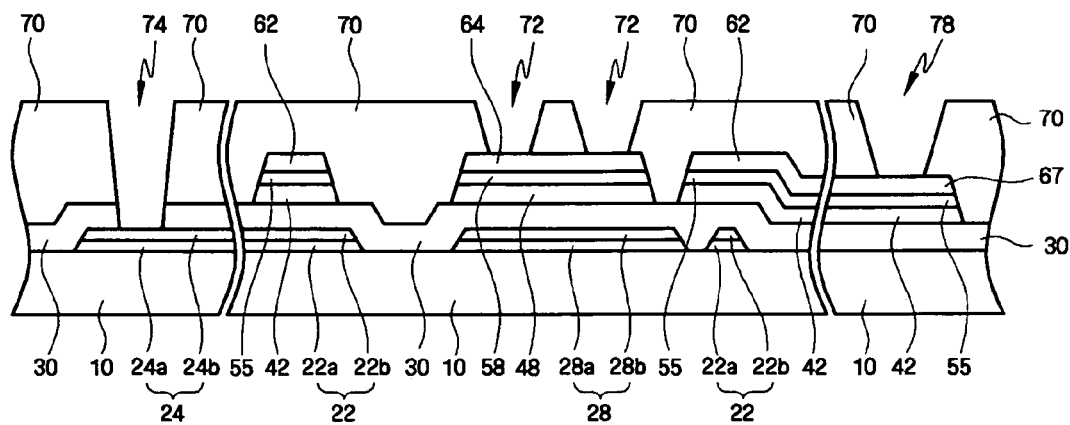
Figure 11B:
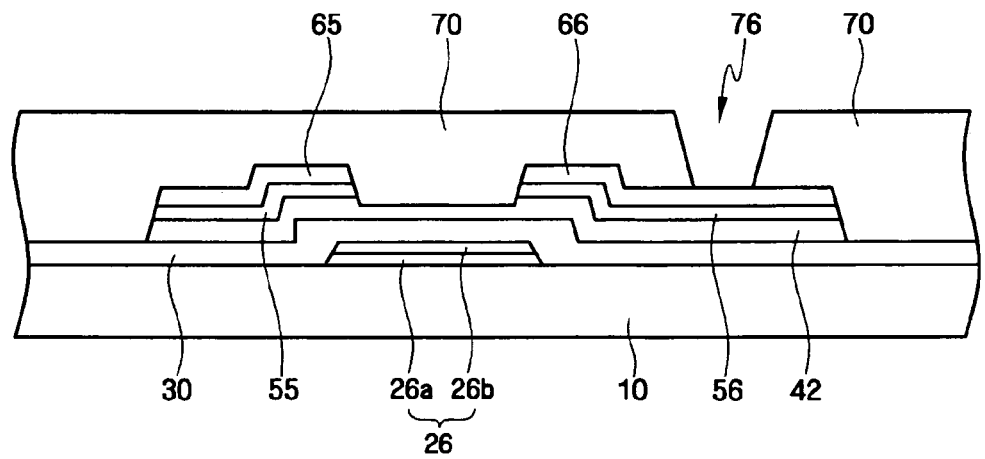

Next, as shown in FIGS. 10A and 10B, a passivation layer 70 is formed by growing a a-Si:C:O film or an a-Si:O:F film by chemical vapor deposition ("CVD"), by coating an organic insulating film. Subsequently, as shown in FIGS. 11A and 11B, the passivation layer 70 is photo-etched together with the gate insulating layer 30 to form contact holes 76, 74, 78 and 72 exposing the drain electrode 66, the gate line pad 24 and the data line pad 68 and the storage capacitor conductor pattern 64, respectively.

Finally, referring back to FIGS. 1 through 3, an ITO layer or an IZO layer is deposited and photo-etched to a plurality of pixel electrodes 82 each connected to the drain electrode 66 and the storage capacitor conductor pattern 64, a plurality of auxiliary gate line pads 86 and a plurality of auxiliary data line pads 88 each connected to the gate line pad 24 and the data line pad 68, respectively. A pre-heating process using nitrogen gas is preferably performed before depositing ITO or IZO. This is required for preventing the formation of metal oxides on the exposed portions of the metal layers 24, 64, 66 and 68 through the contact holes 72, 74, 76 and 78.

Thus, an exemplary embodiment TFT substrate of the present disclosure and an exemplary embodiment method of manufacturing the same have been described above. According to these exemplary embodiments, after sequentially depositing a chromium (Cr) layer and an aluminum (Al) layer, the chromium (Cr) layer is etched twice, thereby preventing conductor layers for data and gate wires from being undercut and ultimately preventing defects of an image when an LCD displays an image.

While the present invention has been particularly shown and described with reference to exemplary embodiments thereof, it shall be understood by those of ordinary skill in the pertinent art that various changes in form and details may be made therein without departing from the spirit and scope of the present invention as defined by the following claims. Therefore, it is to be understood that the above-described embodiments have been provided only in a descriptive sense, and must not be construed as placing any limitation on the scope of the invention.

What is claimed is:

1. A method of manufacturing a thin film transistor (TFT) substrate, the method comprising:

forming a first metal layer made of at least one low resistance material selected from the group consisting of aluminum (Al), aluminum neodymium (AlNd), copper (Cu), and silver (Ag);

forming a second metal layer comprising chromium (Cr) on the first metal layer;

forming a third metal layer comprising chromium nitride (CrNx) on the second metal layer;

forming an etch mask on the third metal layer, wet etching the third and second metal layers using the etch mask and then wet etching the first metal layer using the etch mask, and forming a third metal layer pattern, a second metal layer pattern and a first metal layer pattern, respectively; and selectively re-wet etching the second and third metal layer patterns using the etch mask to make widths of the second and third metal layer patterns smaller than a width of the first metal layer pattern, and completing a gate wire comprising the three metal layers, wherein the gate wire includes a gate line, a gate electrode, and a gate line pad having an auxiliary gate line pad physically contacting the top of the gate line pad.

2. The method of claim 1, wherein a distance between a sidewall of the first metal layer pattern and a sidewall of the second metal layer pattern is equal to or less than 1 μm.

3. The method of claim 1, wherein the third metal layer has a thickness of 200 Å or less.

4. The method of claim 1, after the completing the gate wire, further comprising:
forming a semiconductor pattern and a conductor pattern on the gate wire;
forming a passivation layer for protecting the semiconductor pattern and the conductor pattern, and etching the passivation layer to form contact holes partially exposing the gate wire and the conductor pattern; and
forming a pixel electrode on the passivation layer.

5. A method of manufacturing a thin film transistor (TFT) substrate, the method comprising:
forming a first conductive layer made of at least one low resistance material;
forming a second conductive layer comprising chromium (Cr) or Cr alloy material on the first conductive layer;
forming a third conductive layer comprising chromium (Cr) and nitrogen (N) on the second conductive layer;
forming an etch mask on the third conductive layer, sequentially wet etching the third and second conductive layers and the first conductive layer using the etch mask, and forming a third conductive layer pattern, a second conductive layer pattern and a first conductive layer pattern, respectively; and
selectively re-wet etching the second and third conductive layer patterns using the etch mask to make widths of the second and third conductive layer patterns smaller than a width of the first conductive layer pattern.

6. The method of claim 5, further comprising completing a gate wire from the third, second and first conductive layer patterns.

7. The method of claim 5, further comprising:
forming a photoresist pattern having a first portion and a second portion; and
adjusting a ratio of the thicknesses of the first portion and the second portion depending on process conditions of subsequent etching steps.

8. The method of claim 7, wherein the thickness of the first portion is less than or equal to about half of that of the second portion.

9. The method of claim 7, further comprising providing a position-dependent thickness of a photoresist pattern with at least one of a slit pattern, a lattice pattern or a translucent film provided on the etch mask to adjust light transmittance in a data wire area.

10. A method as defined in claim 9, wherein a slit pattern is used having a width of the slits and a gap between the slits that is smaller than a resolution of an exposer used for the photolithography.

11. A method of manufacturing a thin film transistor (TFT) substrate, the method comprising:
forming a first metal layer made of at least one low resistance material selected from the group consisting of aluminum (Al), aluminum neodymium (AlNd), copper (Cu), and silver (Ag);
forming a second metal layer comprising chromium (Cr) on the first metal layer;
forming a third metal layer comprising chromium nitride (CrNx) on the second metal layer;
forming a photoresist pattern on the third metal layer;
etching the third, second and first metal layers; and
forming a three layered pattern.

12. The method of claim 11, wherein a distance between a sidewall of the first metal layer pattern and a sidewall of the second metal layer pattern is less than or equal to 1 μm.

13. The method of claim 12, wherein the third metal layer has a thickness of 200 Å or less.

14. The method of claim 11, wherein the three layered pattern is a gate wire.

15. The method of claim 14, wherein the third metal layer has a thickness of 200 Å or less.

16. The method of claim 14, further comprising:
forming a semiconductor pattern and a data wire on the gate wire;
forming a passivation layer for protecting the semiconductor pattern and the data wire, and etching the passivation layer to form contact holes partially exposing the gate wire and the data wire; and
forming a pixel electrode on the passivation layer.

17. The method of claim 16, further comprising:
forming a photoresist pattern having a first portion and a second portion; and
adjusting a ratio of the thicknesses of the first portion and the second portion.

18. The method of claim 17, wherein the thickness of the first portion is less than or equal to about half the thickness of the second portion.

19. The method of claim 17, further comprising providing a position-dependent thickness of a photoresist pattern with at least one of a slit pattern, a lattice pattern, or a translucent film provided on the etch mask to adjust light transmittance in a data wire area.

20. A method as defined in claim 19 wherein a slit pattern is used, the slit pattern having a width of the slits and a gap between the slits that is smaller than a resolution of an exposer used for the photolithography.

* * * * *